(12) United States Patent
Nakamura

(10) Patent No.: US 6,344,992 B1
(45) Date of Patent: Feb. 5, 2002

(54) SRAM OPERATING WITH A REDUCED POWER DISSIPATION

(75) Inventor: Noritsugu Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/721,489

(22) Filed: Nov. 22, 2000

(30) Foreign Application Priority Data

Nov. 25, 1999 (JP) .............................. 11-334437

(51) Int. Cl.$^7$ .............................................. G11C 11/00
(52) U.S. Cl. ...................................... 365/154; 365/203
(58) Field of Search ................................. 365/154, 203

(56) References Cited

U.S. PATENT DOCUMENTS 6,205,556 B1 * 3/2001 Watanabe et al. ........... 713/330

* cited by examiner

*Primary Examiner*—David Nelms
*Assistant Examiner*—M. Tran

(57) ABSTRACT

A SRAM has a plurality of four-transistor/no-load memory cells each operating in a precharge mode for maintaining stored data based on off-leak currents of MOSFETs. The SRAM has a reference voltage generator, an impedance converter, a plurality of word line drivers, and a plurality of word lines each extending along a row of the memory cells.

15 Claims, 9 Drawing Sheets

FIG. 1
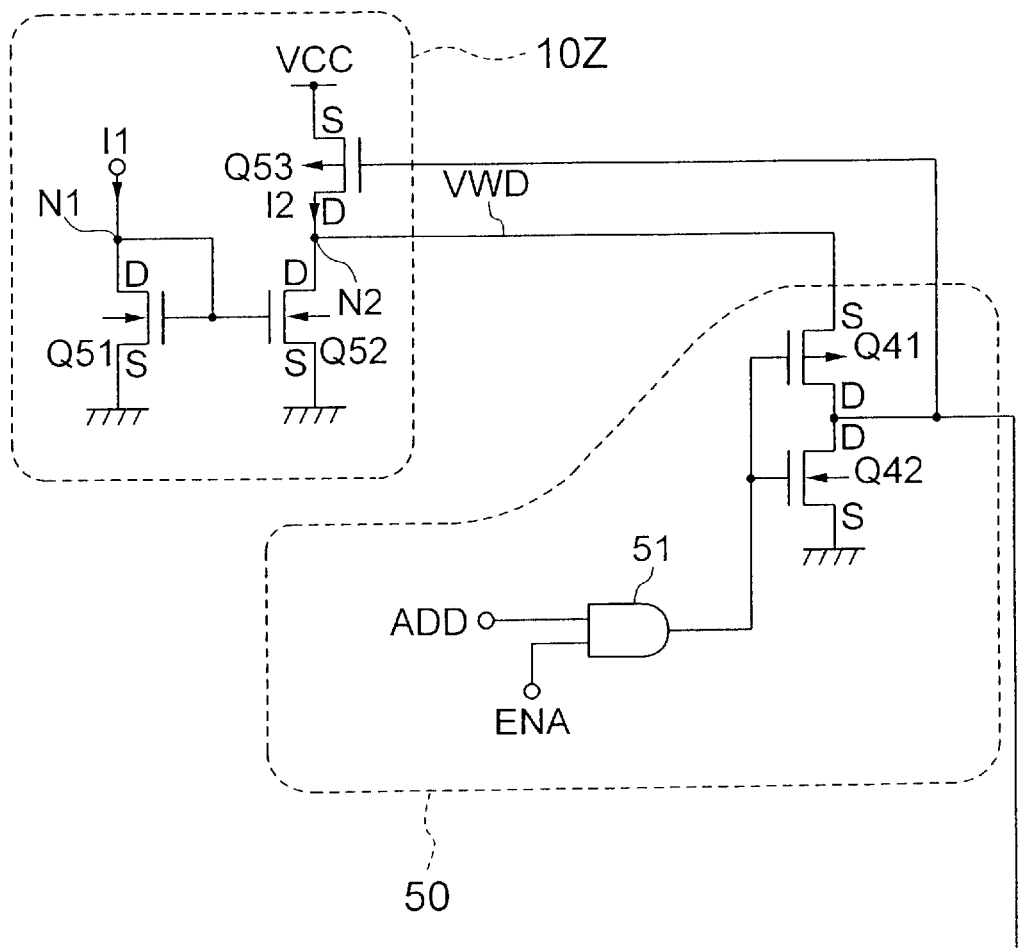
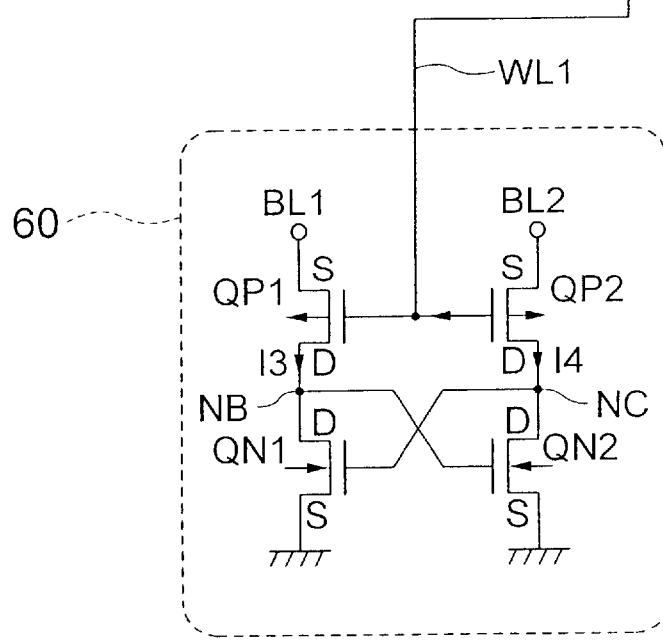

SRAM OPERATING WITH A REDUCED POWER DISSIPATION

BACKGROUND OF THE INVENTION (a) Field of the Invention

The present invention relates to a SRAM (static random access memory) operating with a reduced power dissipation and, more particularly, to a technique for reduction of power dissipation in a high-speed SRAM having four-transistor/no-load memory cells having a precharge function based on an off-leak current.

(b) Description of the Related Art

A high-speed SRAM which includes an array of four-transistor memory cells each having a precharge function based on an off-leak current is increasingly used for responding to the recent commercial demand for a lower power dissipation and an increased integration of the SRAM. The four-transistor memory cell is also called a no-load memory cell.

FIG. 1 shows a conventional SRAM having four-transistor memory cells, wherein a word line driver 50 and a reference voltage generator 10Z are disposed for each of the word lines WL1 which extend in the row direction of a memory cell array. Reference voltage generator 10Z delivers a precharge voltage VWD directly to the word line driver 50, which switches the potential of the word line WL1 activating a row of memory cells 60 between the ground potential and the precharge voltage level VWD. A memory cell 60 is activated for a read/write operation by the ground potential of the corresponding word line WL1, wherein the memory cell 60 receives therein data or delivers therefrom data, the data depending on the potentials of the corresponding pair of bit lines BL1 and BL2.

In a precharge operation, both the address signal ADD and the enable signal ENA supplied to the word line driver 50 assume a low level to turn on a pMOSFET Q41 and turn off an nMOSFET Q42 in the word line driver 50, whereby the word line WL1 assumes the precharge level VWD. The bit lines BL1 and BL2 assume a source potential level VCC in this mode. Due to a ratio of two orders in magnitude between the off-leak current of the drive nMOSFETs QN1 and QN2 and the off-leak current of the transfer transistors QP1 and QP2, the latter being higher, the storage nodes NC and NB assume a high level and a low level, respectively, for example, based on the original state thereof, whereby the memory cell 60 maintains data "1". The current I1 flowing through node N1, the current I2 flowing through node N2, both in the reference voltage generator 10Z, and the current I3 flowing through the storage node NB in the memory cell 60 are equal to one another, due to a current mirror configurations of transistors Q51 and Q52, and of transistors Q53 and QP1, wherein these transistors in each current mirror configuration have an equal transistor size.

FIG. 2 shows the temperature dependency of the off-leak current of nMOSFET and pMOSFET, wherein the off-leak current is plotted on ordinate and the temperature is plotted on abscissa. The difference in the off-leak current between pMOSFET and nMOSFET (or off-leak current difference) increases with a rise of the temperature from 25° C., wherein the off-leak current ratio at 100° C. is almost two orders larger compared to that at a room temperature or 25° C. The off-leak current difference should be larger in view of a stable precharge operation in the SRAM memory cell. However, the off-leak current difference is sometimes too small due to the low ambient temperature or the variations of the transistor characteristics depending on the process conditions during the fabrication thereof. In FIG. 1, current I3, which is equal to current I1 supplied to the reference voltage generator 10Z, should be sufficiently larger compared to the off-leak current of drive transistor QN1 or QN2 for a stable precharge function.

In the conventional technique, the reference voltage generator 10Z is disposed for each word line WL1, together with the word line driver 50. This causes a larger chip area for the SRAM. In addition, the word line WL1, connected to a row of memory cells 60, generally has a large parasitic capacitance. Thus, a large voltage fluctuation may arise on the output line of the reference voltage generator 10Z due to the noise generated on the word line WL1 having a large parasitic capacitance.

Further, a measure for solving the problem in the small off-leak current difference as described before is not considered in the conventional technique. Thus, for a stable precharge operation, a sufficiently large current should be supplied as current I1 in the reference voltage generator 10Z, and the large currents I3 flowing through all the memory cells in the precharge operation increase the power dissipation in the SRAM.

SUMMARY OF THE INVENTION

It is an object of the present invention to provide a SRAM including four-transistor/no-load memory cells, which is capable of operating with a lower power dissipation in a stable precharge operation and has a smaller chip area.

The present invention provides a static random access memory (SRAM) including a memory cell array including a plurality of four-transistor memory cells arranged in a matrix, each of said memory cells operating for reading/writing data in a read/write mode or maintaining data in a precharge mode based on an off-leak current, a plurality of word lines each disposed for a corresponding row of the memory cells, a plurality of pairs of bit lines each disposed for a corresponding column of the memory cells, a reference voltage generator for generating a reference voltage, an impedance converter for receiving the reference voltage to deliver a precharge voltage having a lower internal impedance compared to the reference voltage, a word line driver disposed for each of the word lines for switching a corresponding one of the word lines between a read/write potential for the read/write mode and a precharge voltage for the precharge mode.

In accordance with the SRAM of the present invention, the impedance converter connected between the reference voltage generator and the word line drivers affords reduction of the number of reference voltage generators in the conventional SRAM and a stable precharge operation of each memory cell.

The term "precharge" as used in this text means an operation of each memory cell wherein the each memory cell maintains the stored data by using a off-leak current difference between the drive transistors and the transfer transistors thereof while maintaining the gate potential of the transfer transistors at a precharge voltage.

The above and other objects, features and advantages of the present invention will be more apparent from the following description, referring to the accompanying drawings.

BRIEF DESCRIPTION OF THE DRAWINGS

FIG. 1 is a circuit diagram of a conventional SRAM.

PREFERRED EMBODIMENTS OF THE INVENTION

Figure 2:
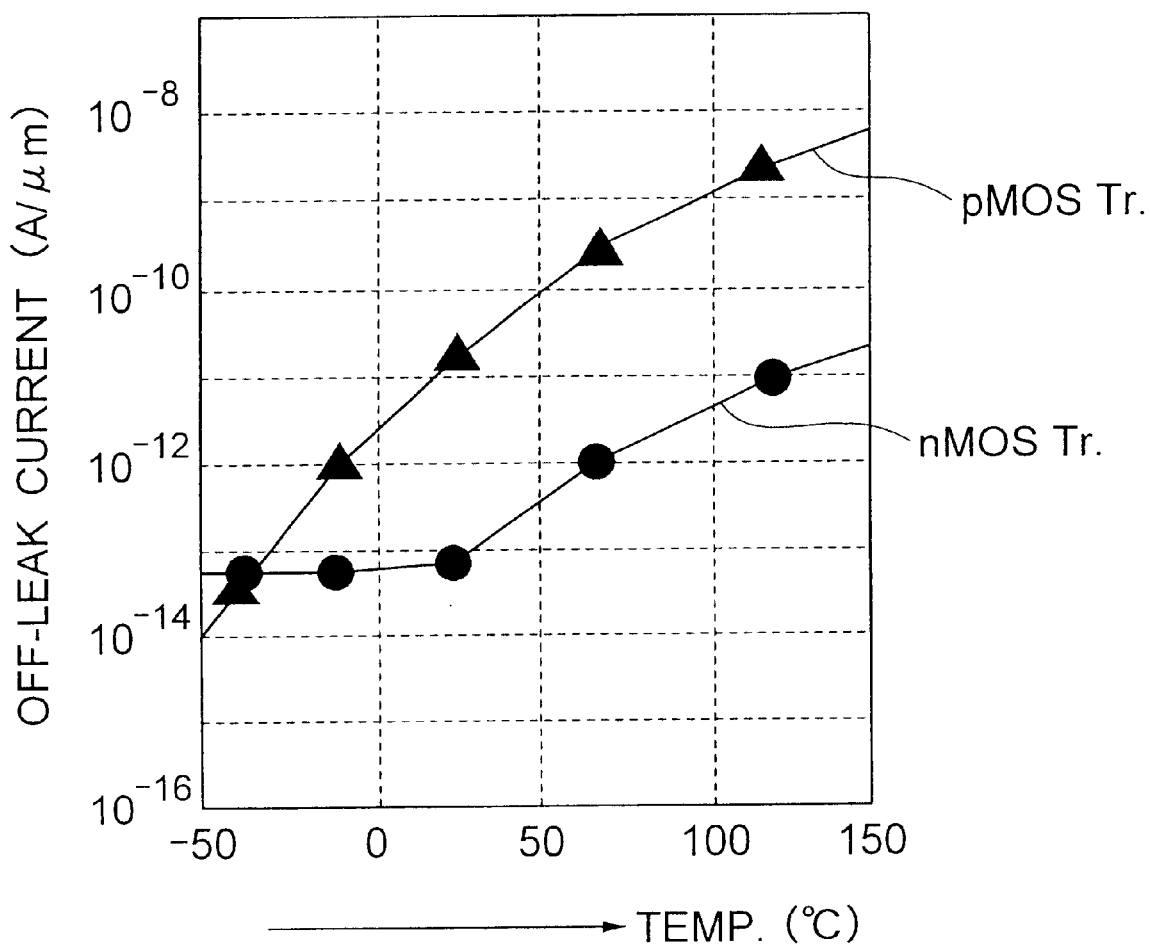
FIG. 2 is a temperature dependence of the off-leak current in a pMOSFET and an nMOSFET.

Now, the present invention is more specifically described with reference to accompanying drawings, wherein similar constituent elements are designated by similar or related reference numerals.

Figure 3:
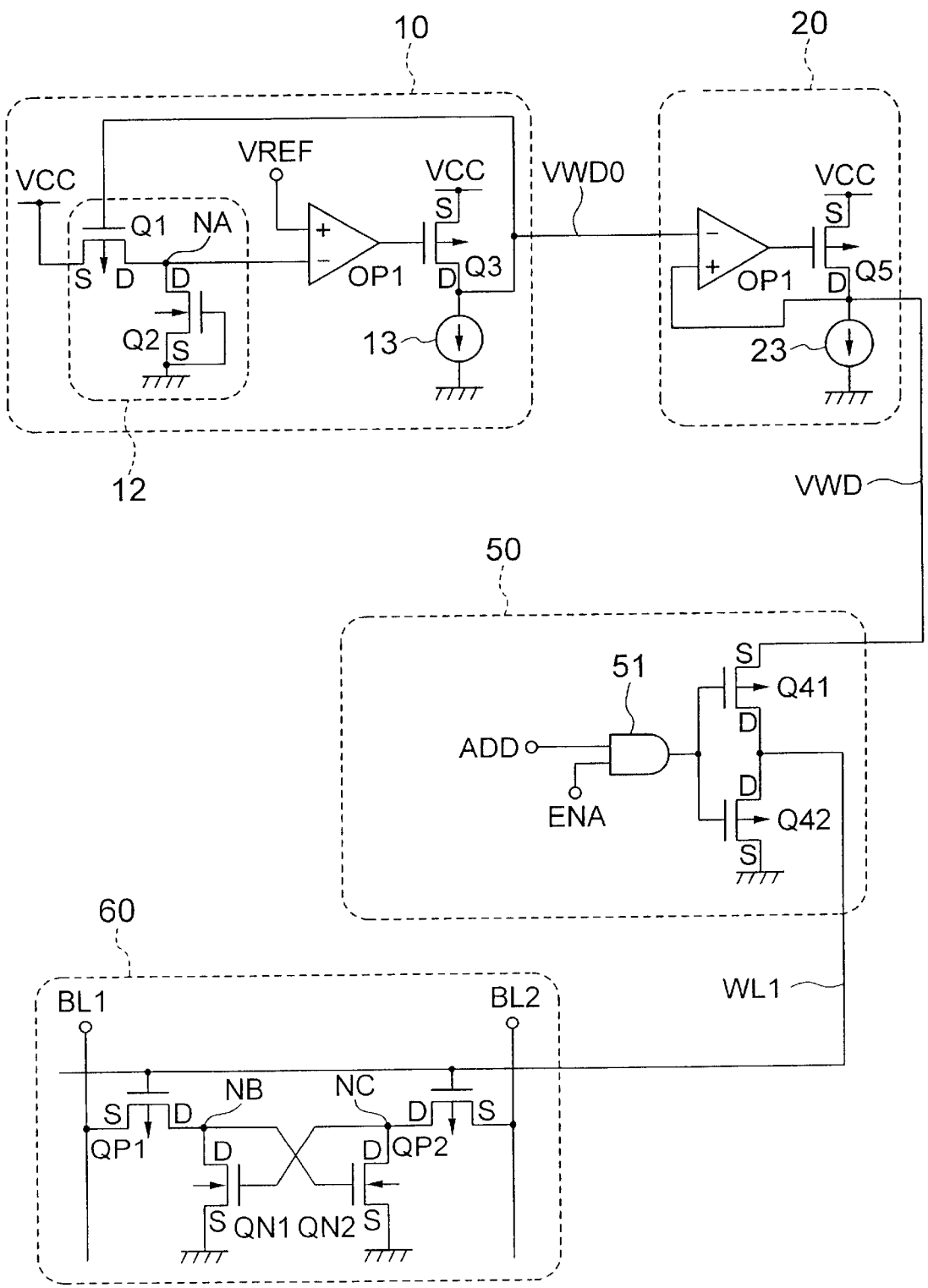
FIG. 3 is a circuit diagram of a SRAM according to a first embodiment of the present invention.

Referring to FIG. 3, a SRAM according to a first embodiment of the present invention includes a single reference voltage generator 10 for generating a reference precharge voltage VWD0, a single impedance converter 20 for receiving the reference precharge voltage VWD0 to generate a precharge voltage VWD with a lower internal impedance, a plurality of word line drivers 50 each disposed corresponding to a word line WL1 and switching the corresponding word line WL1 between the ground potential and the precharge voltage level VWD, a plurality of memory cells 60 arranged in a matrix, and a plurality of pairs of bit lines BL1 and BL2 each disposed for a corresponding column of the memory cells,. Each row of memory cells is activated by a corresponding word line driver 50, and one of the memory cells in the row receives/delivers data through a corresponding pair of bit lines BL1 and BL2, the potentials of which depend on the data to be received or delivered.

Each memory cell 60 includes a pair of transfer pMOS transistors QP1 and QP2, and a pair of drive nMOS transistors QN1 and QN2 which define the potentials of the storage nodes NB and NC in association. Each of the transfer transistors QP1 and QP2 has a gate connected to a corresponding word line WL1. Transfer transistor QP1 has a source connected to bit line BL1 and a drain connected to storage node NB, whereas transfer transistor QP2 has a source connected to bit line BL2 and a drain connected to storage node NC. Drive transistor QN1 has a source connected to the ground, a drain connected to storage node NB and a gate connected to storage node NC, whereas drive transistor QN2 has a source connected to the ground, a drain connected to storage node NC and a gate connected to storage node NB.

The reference voltage generator 10 includes a monitor circuit 12, an operational amplifier OP1, a pMOS transistor Q3, and a current source 13, and has a voltage follower configuration using a feed-back loop.

The monitor circuit 12 includes pMOS transistor Q1 which has transistor characteristics equal to the transistor characteristics of transfer transistors QP1 and QP2, and an nMOS transistor Q2 which has transistor characteristics equal to the transistor characteristics of drive transistors QN1 and QN2. The pMOS transistor Q1 has a source connected to a source line VCC, and a drain connected to the drain of nMOS transistor Q2 through the output node NA of the monitor circuit 12. The nMOS transistor Q2 has gate and source connected together to the ground, and functions as a load resistor.

The operational amplifier OP1 has a power source terminal (not shown) connected to the source line VCC, a non-inverting input connected to an internal reference voltage source VREF, an inverting input connected to node NA and an output connected to the gate of pMOS transistor Q3. The pMOS transistor Q3 has a source connected to the source line VCC and a drain connected to the ground through the current source 13, thereby delivering the reference precharge voltage VWD0 through the drain of pMOS transistor Q3.

The impedance converter 20 includes an operational amplifier OP2, a pMOS transistor Q5 and a current source 23.

Operational amplifier OP2 has a power source terminal connected to the source line VCC, an inverting input for receiving the reference precharge voltage VWD0, a non-inverting input connected to the drain of pMOS transistor Q5, and an output connected to the drain of pMOS transistor Q5. The pMOS transistor Q5 has a source connected to the source line VCC, and a drain connected to the ground through the current source 23.

The word line driver 50 includes a 2-input AND gate 51, a pMOS transistor Q41 having a source receiving the precharge voltage VWD, and an nMOS transistor Q42 having a source connected to the ground. AND gate 51 receives an address signal ADD and an enable signal ENA to deliver an output signal to the gates of transistors Q41 and Q42, the drains of which are connected to word line WL1.

In an alternative configuration, the source of pMOS transistor Q1 may be connected to another source line having a source potential lower than VCC, or the source of pMOS transistor Q3 and the power source terminal of operational amplifier OP1 may be connected to another source line having a source potential higher than VCC. In either case, the reference voltage generator 10 operates in a more suitable operational range, which enables the design of operational amplifier OP1 more feasible.

In a further alternative configuration, the source of pMOS transistor Q5 and the power source terminal of operational amplifier OP2 are connected to another source line having a source potential higher than VCC. In this case, the impedance converter 20 operates in a more suitable operational range, which enables the design of operational amplifier OP2 more feasible.

The reference voltage generator 10 compares the potential of node NA against the internal reference voltage VREF to maintain the potential of node NA at VREF. More specifically, if the potential of node NA falls, the output voltage of operational amplifier OP1 rises to raise the ON-resistance of pMOS transistor Q3, which lowers the reference precharge voltage VWD0. This increases the drain current of pMOS transistor Q1, and raises the potential of node NA. In an opposite case, the potential rise of node NA itself causes a reduction of the potential of node NA by a feed-back loop.

In the above embodiment, the internal reference voltage VREF is set at a suitable voltage in consideration of the configuration of the monitor circuit 12 and the influence by the coupling of bit lines BL1 and BL2. If the internal reference voltage VREF is set at a higher voltage, operational amplifiers OP1 and OP2 operate at a higher voltage range near the source potential VCC, which degrades the characteristics of operational amplifiers OP1 and OP2. On the other hand, if the internal reference voltage VREF is set at a lower voltage, the potentials of storage nodes NB and NC are not maintained at suitable potentials for storing data thereon.

Generation of noise in a memory cell is less frequent in a standby mode thereof compared to a read/write operation mode for the memory cells. Thus, it is preferable that the off-leak current in the memory cell be lowered in a standby mode thereof. Thus, the level of the internal reference voltage VREF is switched between a standby mode and an operational mode, whereby the potential of the internal reference voltage VREF in the standby mode is set at a higher voltage compared to that in the operational mode. A voltage divider using a set of resistors may be used for generating the internal reference voltage VREF if the accuracy thereof is not important. On the other hand, a bandgap circuit may also used for generating the internal reference voltage if a higher accuracy is needed.

The impedance converter 20 has a feed-back loop for implementing a voltage follower (or buffer). The impedance converter 20 receives the reference precharge voltage VWD0 to deliver a precharge voltage VWD, which is equal to the reference precharge voltage and has a lower internal impedance.

The word line driver 50 switches the voltage of a corresponding word line WL1 based on the input address signal ADD and the enable signal ENA for the SRAM. The word line driver 50 delivers a high precharge level (inactive level) to the word line WL1 when at least one of the address signal ADD and the enable signal ENA assumes a low level, whereas the word drive 50 delivers a ground level (active level) to the word line WL1 when both the address signal ADD and the enable signal ENA assume a high level.

A read/write operation is effected in a specified memory cell 60 by the on-states of transfer transistors QP1 and QP2 which couple a pair of bit lines BL1 and BL2 to the storage nodes NB and NC, respectively.

In a precharge operation, the bit lines BL1 and BL2 assume the VCC source potential. The memory cell 60 stays in a quasi-inactive state wherein the transfer transistors QP1 and QP2 follow the potential of the precharge voltage VWD delivered to the gates thereof. At this state, off-leak currents flow through storage nodes NB and NC to maintain the previous potentials, whereby stored data is maintained.

In the configuration of the above embodiment, the impedance converter 20 provided between the reference voltage generator 10 and a plurality of word line drivers 50 allows the single reference voltage generator 10 to control the plurality of word line drivers 50. This affords reduction of number of reference voltage generators 10 and reduction of chip size of the SRAM and a stable precharge operation. The switching of the off-leak current between a standby mode and an operational mode affords reduction of power dissipation during the precharge operation.

Figure 4:
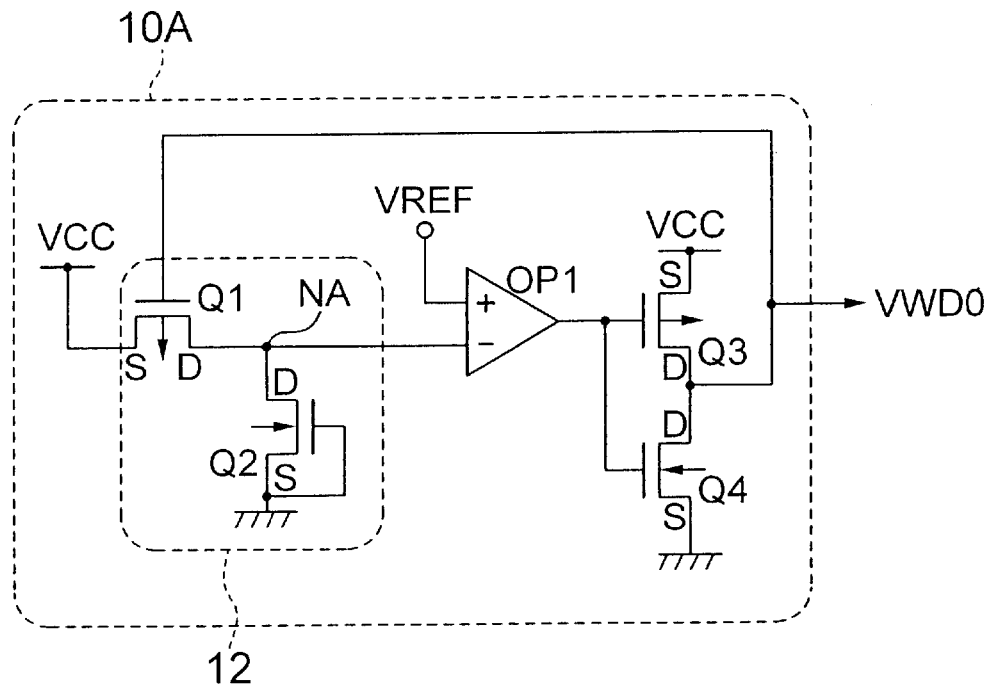
FIG. 4 is a circuit diagram of a reference voltage generator in a SRAM according to a second embodiment of the present invention.

Referring to FIG. 4, a reference voltage generator 10A in a SRAM according to a second embodiment of the present invention is similar to the reference voltage generator 10 in the first embodiment except that an nMOS transistor Q4 is connected between pMOS transistor Q3 and the ground line in the present embodiment instead of the current source 13.

The complementary configuration of the transistors Q3 and Q4 allows a further reduction of power dissipation.

Figure 5:
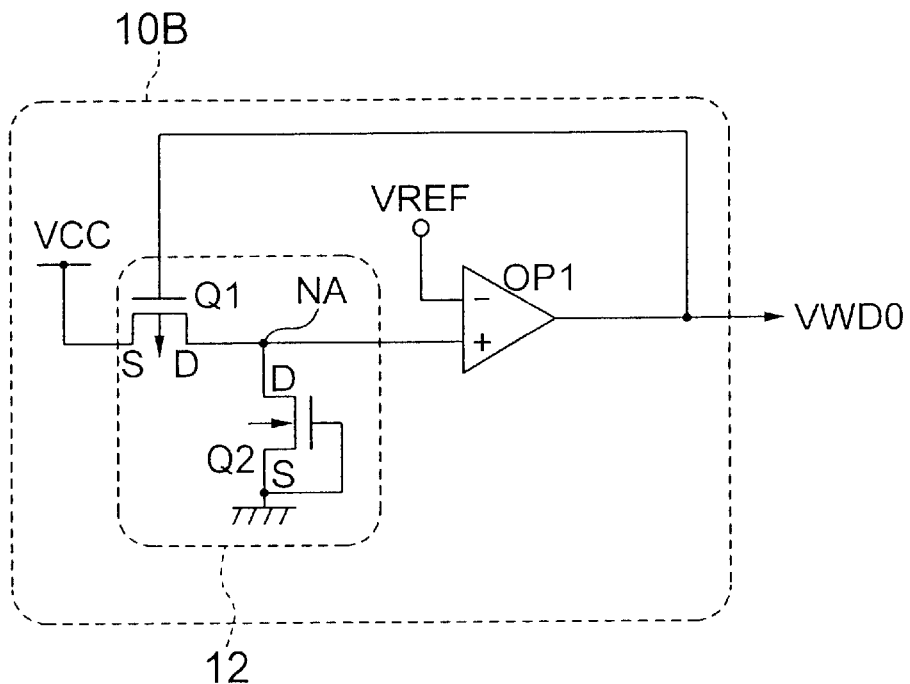
FIG. 5 is a circuit diagram of a reference voltage generator in a SRAM according to a third embodiment of the present invention.

Referring to FIG. 5, a reference voltage generator 10B in a SRAM according to a third embodiment of the present invention includes a monitor circuit 12 and an operational amplifier OP1 which are similar to those in the first embodiment. The output of operational amplifier OP1 is directly connected to the gate of pMOSFET Q1. In the present embodiment, by removing transistor Q3 and the current source 13, the number of constituent elements can be reduced.

Figure 6:
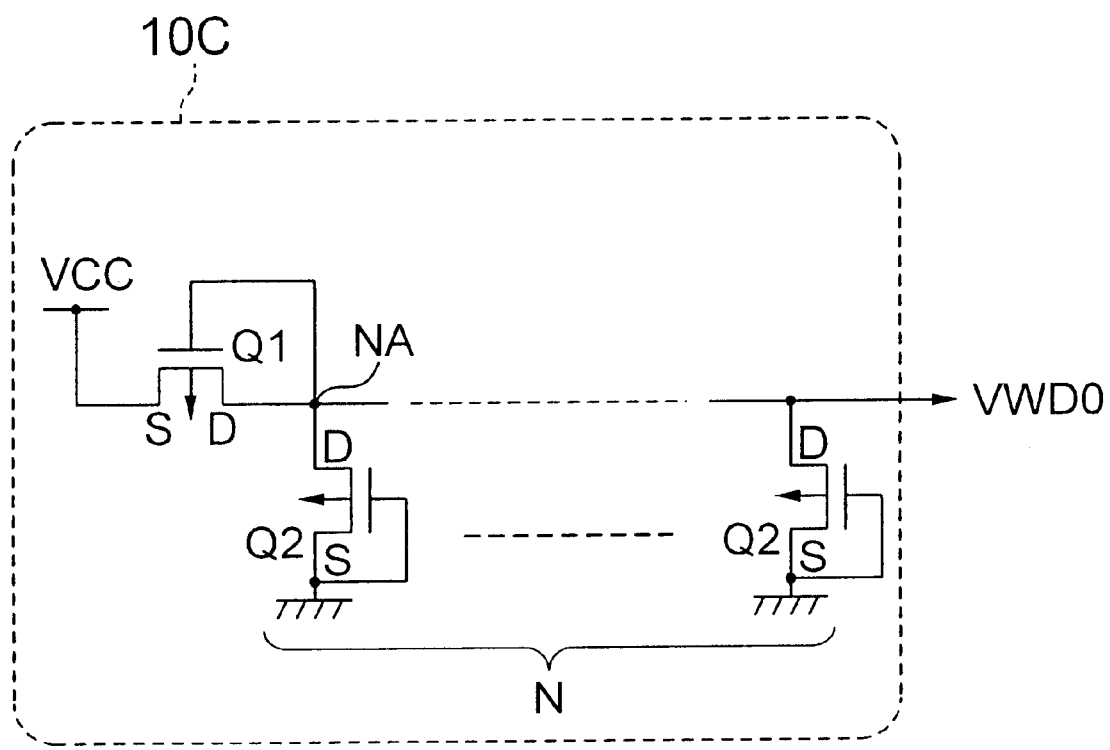
FIG. 6 is a circuit diagram of a reference voltage generator in a SRAM according to a fourth embodiment of the present invention.

Referring to FIG. 6, a reference voltage generator 10C in a SRAM according to a fourth embodiment of the present invention includes a pMOS transistor Q1 having a source connected to the VCC source line and a plurality of (N in number) nMOS transistors Q2 connected in parallel between pMOS transistor Q1 and the ground, with the gates of nMOS transistors Q2 being connected to the ground. The drains of pMOS transistor Q1 and nMOS transistors Q2 are connected together for delivering a reference precharge voltage VWD0. The number "N" may be 100 or more, whereby the "off-leak current ratio" between the pMOS transistor and the nMOS transistor may be two orders in magnitude in a decimal notation. The plurality of nMOS transistors function as load resistors.

The reference voltage generator 10C in the present embodiment achieves a simple structure and has an excellent temperature characteristic. In addition, internal reference voltage is not needed.

Figure 7:
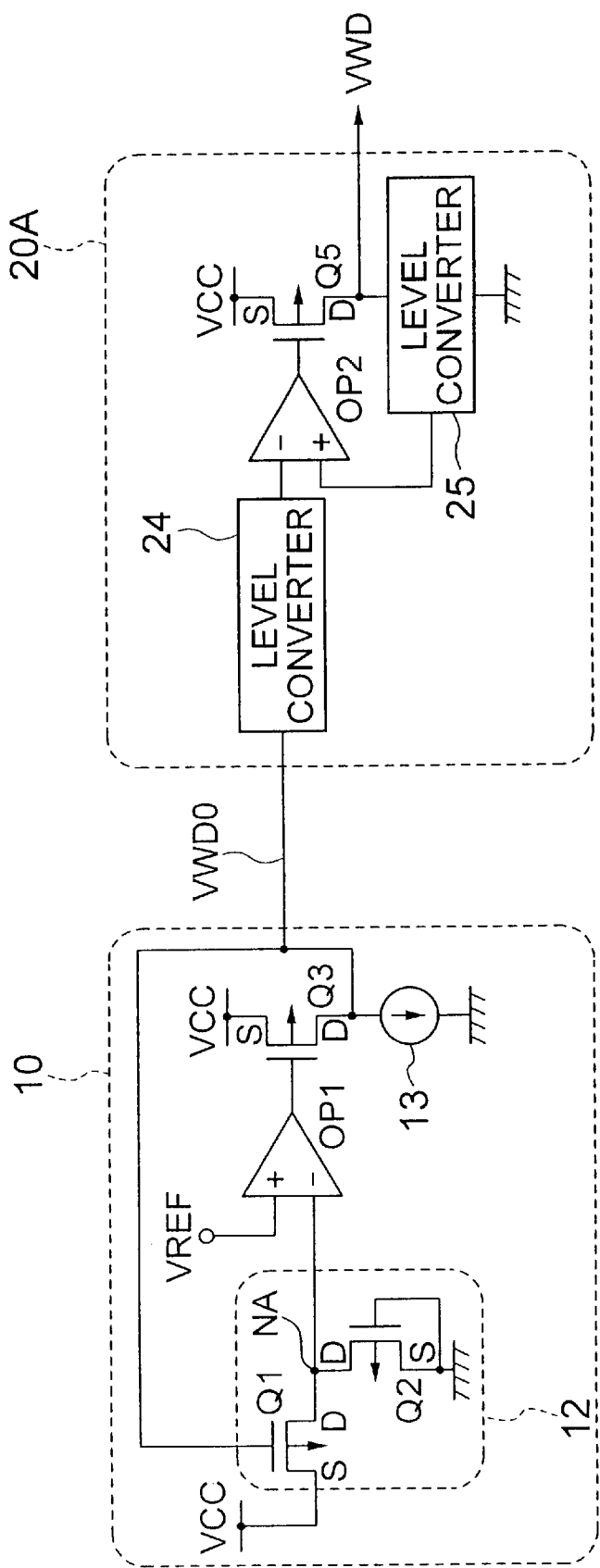
FIG. 7 is a circuit diagram of a portion of a SRAM according to a fifth embodiment of the present invention.

Referring to FIG. 7, a SRAM according to a fifth embodiment of the present invention is similar to the first embodiment except for the configuration of the impedance converter 20A. The impedance converter 20A in the present embodiment includes a first level converter 24 at the input stage of the impedance converter 20A and a second level converter 25 instead of the current source 23 in the first embodiment. The second level converter 25 is connected between the output node VWD of the impedance converter and the ground, acting as a current source or load. The second level converter 25 has an input node receiving the output precharge signal VWD, and an output node connected to the non-inverting input of operational amplifier OP2.

Each of the first and second level converters 24 and 25 delivers an output signal having a reduced voltage level compared to the input signal supplied thereto. Operational amplifier OP2, receiving an output of the first level converter 24 at the inverting input and an output of the second level converter 25 at the non-inverting input, operates within a suitable operational range. The level converters 24 and 25 may be a voltage divider implemented by resistors. By using the level converters 24 and 25 having different conversion ratios for voltage level, a further improvement can be achieved in the characteristic of operational amplifiers OP2.

Figure 8:
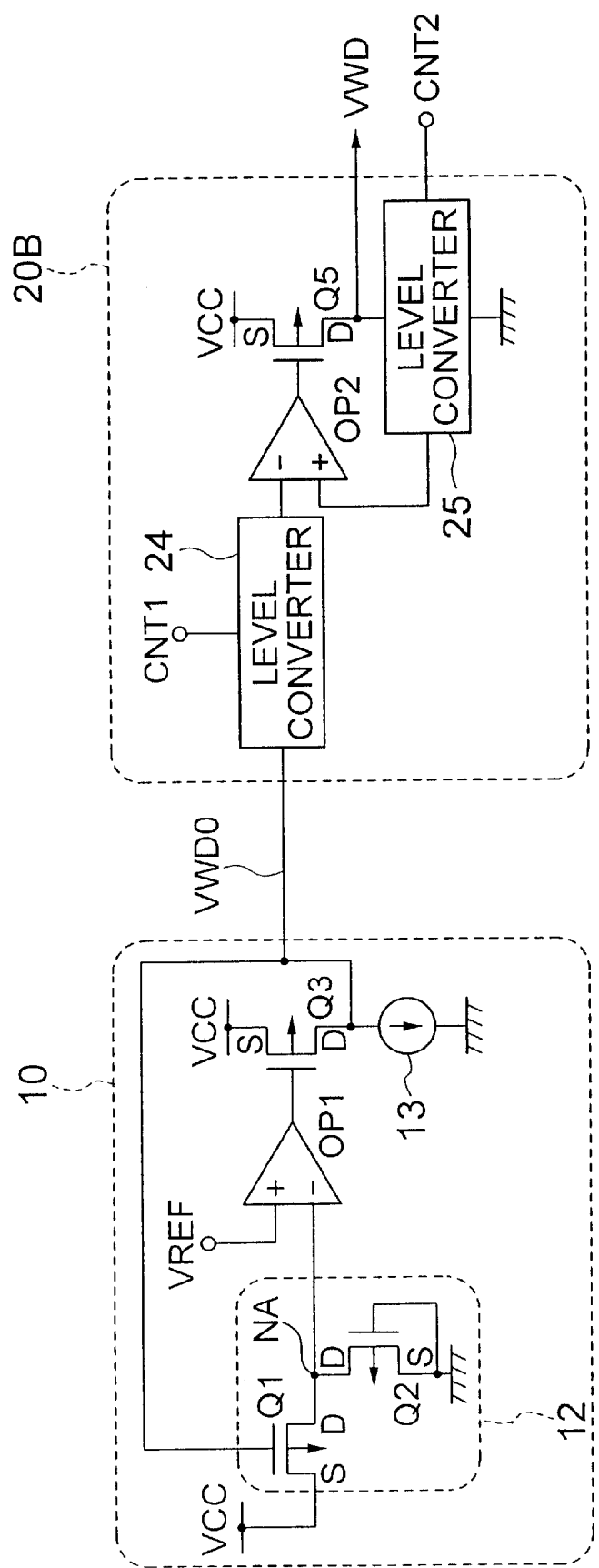
FIG. 8 is a circuit diagram of a portion of a SRAM according to a sixth embodiment of the present invention.

Referring to FIG. 8, an impedance converter 20B used in a SRAM according to a sixth embodiment of the present invention is similar to the impedance converter 20A except that each of the level converters 24 and 25 in the present embodiment has a control input CNT1 or CNT2, through which a control signal for selecting the conversion ratio or voltage drop of the level converter 24 or 25 is input. The level converters 24 and 25 may have different voltage drops instead of different conversion ratios.

After an operational test for a final product of the SRAM, the control signals are selected based on the test results to select suitable conversion ratios, to thereby improve the characteristics of operational amplifier OP2 and achieves a stable precharge operation as well as reduction of the power dissipation.

Figure 9:
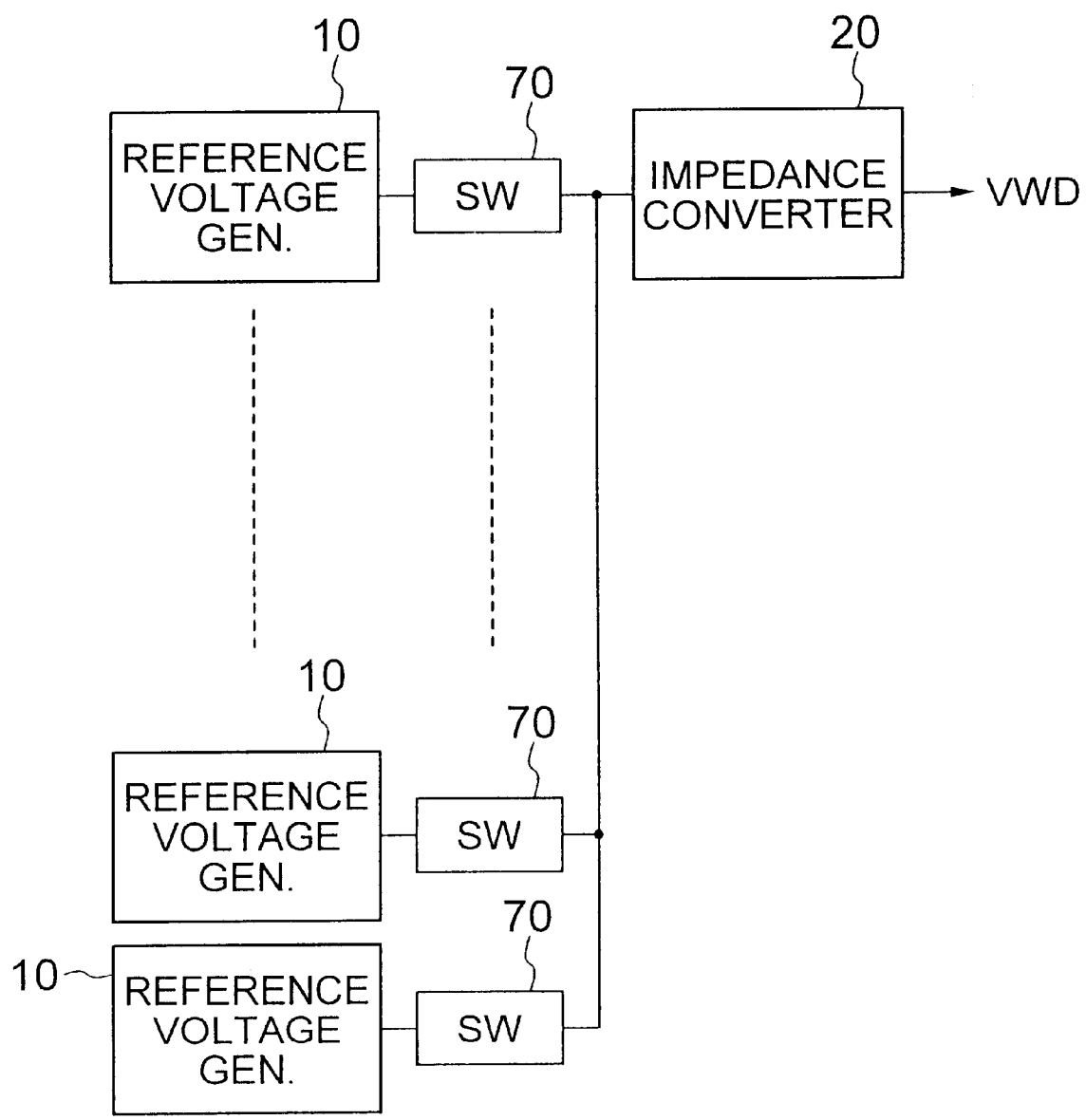
FIG. 9 is a circuit diagram of a SRAM according to a seventh embodiment of the present invention.

Referring to FIG. 9, a SRAM according to a seventh embodiment of the present invention is similar to the first embodiment except that a plurality of reference voltage generators 10 are provided for a single impedance converter 20 in the present embodiment. Each of the reference voltage generators 10 is associated with a switch 70, which is controlled by an external control signal. One of the reference voltage generators 10 is selected by the external control signal after an optimal reference precharge voltage is detected based on the test result.

Generally, it is difficult to determine the optimum reference precharge voltage due to the difficulty in predicting the off-leak current difference. The configuration of the present embodiment achieves selection of an optimum precharge voltage in accordance with the off-leak current difference. The switch 70 may be replaced by a fuse, one of which is left for coupling the output of one of the reference voltage generators 10 to the impedance converter 20.

Figure 10:
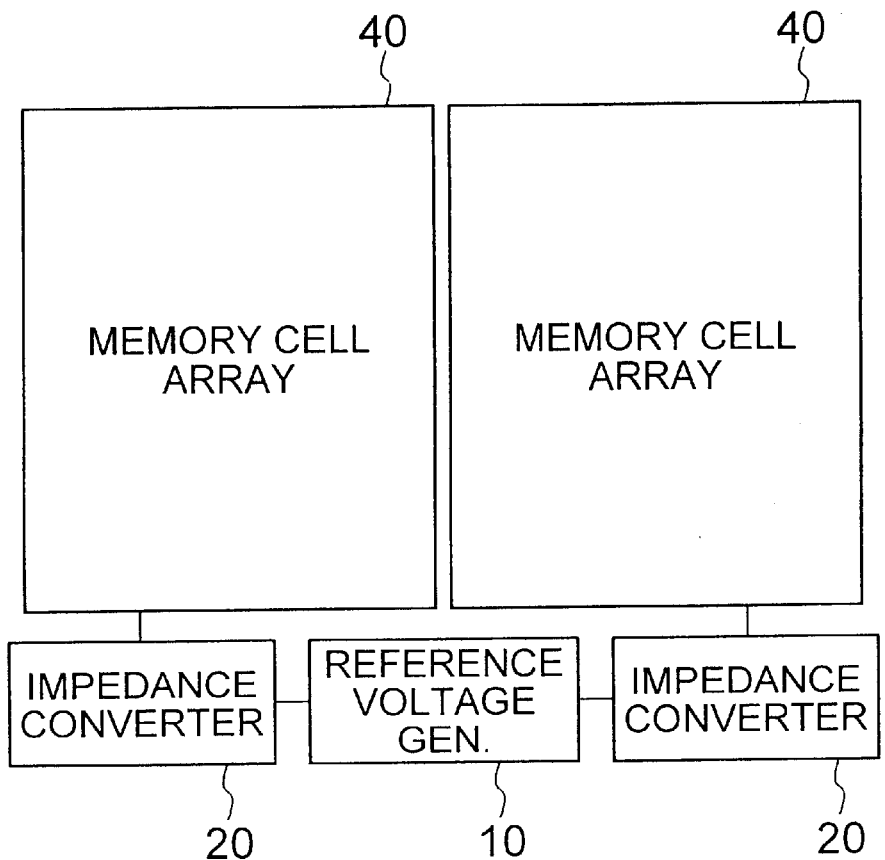
FIG. 10 is a circuit diagram of a SRAM according to a eighth embodiment of the present invention.

Referring to FIG. 10 a SRAM according to a eighth embodiment of the present invention includes a plurality of memory cell arrays 40 each associated with an impedance converter 20. A single reference voltage generator 10 is provided for a plurality of impedance converters 20. The combination of memory cell array 40 and impedance converter 20 is selected based on an enable signal which specifies one of the memory cell arrays 40 for an operational mode. Reduction of power dissipation can be achieved by selecting one of the memory cell arrays 40 while specifying the other of the memory cell arrays 40 for a standby mode.

Figure 11:
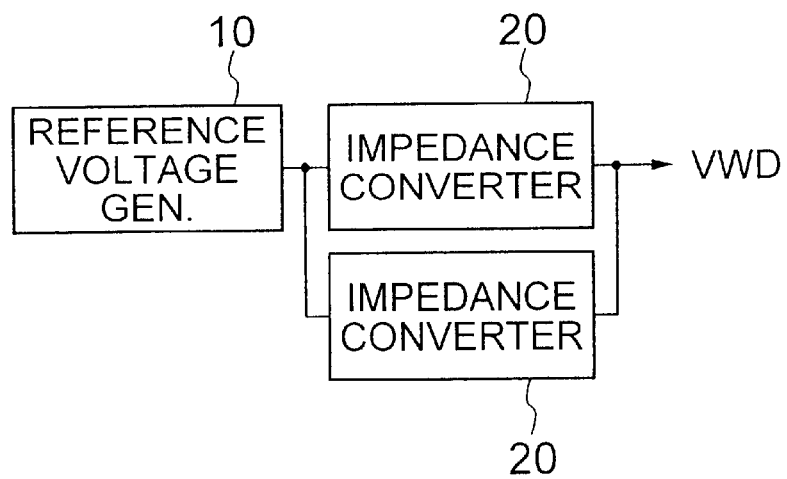
FIG. 11 is a circuit diagram of a SRAM according to a ninth embodiment of the present invention.

Referring to FIG. 11, a SRAM according to a ninth embodiment of the present invention includes a plurality of (two in this case) impedance converters 20 provided to a single reference voltage generator 10. Each impedance converter 20 has a configuration shown in FIG. 3, although both the impedance converters 20 have different current driveabilities. One of the impedance converters 20 having a higher current driveability is used for driving the memory cell array in an operational mode thereof, whereas the other of the impedance converters 20 having a lower current driveability is used for driving the memory cell array in a standby mode thereof.

The reference voltage generator 10 generates a higher reference voltage when the memory cell array is in an operational mode and a lower reference voltage when the memory cell array is in a standby mode, thereby switching the off-leak current between the two modes. This achieves reduction of power dissipation during the standby mode while assuring a stable operation in the operational mode.

Since the above embodiments are described only for examples, the present invention is not limited to the above embodiments and various modifications or alterations can be easily made therefrom by those skilled in the art without departing from the scope of the present invention.

What is claimed is:

1. A static random access memory (SRAM) comprising a memory cell array including a plurality of four-transistor memory cells arranged in a matrix, each of aid memory cells operating for reading/writing data in a read/write mode or maintaining data in a precharge mode based on an off-leak current, a plurality of word lines each disposed for a corresponding row of said memory cells, a plurality of pairs of bit lines each disposed for a corresponding column of said memory cells for supplying said off-leak current, a reference voltage generator for generating a reference voltage, an impedance converter for receiving the reference voltage to deliver a precharge voltage having a lower internal impedance compared to the reference voltage, a word line driver disposed for each of said word lines for switching a corresponding one of said word lines between a read/write potential for said read/write mode and a precharge voltage for said precharge mode.

2. The SRAM as defined in claim 1, wherein said reference voltage generator comprises a monitor circuit including a first transistor and a load resistor connected in series between a first source line and a second source line, an operational amplifier having an inverting input connected to a node connecting said first transistor and said load resistor together, and a non-inverting input for receiving an internal reference voltage, a second transistor having a source connected to said first source line and a gate connected to an output of said operational amplifier, a current source connected between a drain of said second transistor and said second source line, said drain of said second transistor being connected to a gate of said first transistor.

3. The SRAM as defined in claim 1, wherein said reference voltage generator comprises a monitor circuit including a first transistor and a load resistor connected in series between a first source line and a second source line, an operational amplifier having an inverting input connected to a node connecting said first transistor and said load resistor together, and a non-inverting input for receiving an internal reference voltage, a CMOS inverter including a second transistor having a source connected to said first source line and a gate connected to an output of said operational amplifier, and a third transistor having a source connected to said second source line, a drain connected to a drain of said second transistor and a gate connected to the output of said operational amplifier, said drains of said second and third transistors being connected to a gate of said first transistor.

4. The SRAM as defined in claim 1, wherein said reference voltage generator comprises a monitor circuit including a first transistor and a load resistor connected in series between a first source line and a second source line, an operational amplifier having an inverting input connected to a node connecting said first transistor and said load resistor together, a non-inverting input for receiving an internal reference voltage, and an output connected to a gate of said first transistor.

5. The SRAM as defined in claim 1, wherein said reference voltage generator comprises a pMOS transistor having a source connected a first source line and a drain connected to the non-inverting input of said operational amplifier, and at least one load transistor connected between said drain of said first transistor and said second source line.

6. The SRAM as defined in claim 1, wherein said impedance converter comprises a first level converter for receiving the reference voltage from said reference voltage generator to deliver a first signal having a reduced voltage level, a first operational amplifier having an inverting input for receiving the first signal, a first transistor having a source connected to a first source line, a gate connected to an output of said first operational amplifier, and a second level converter having an input connected to a drain of said first transistor and an output connected a non-inverting input of said first operational amplifier.

7. The SRAM as defined in claim 6, wherein said first and second level converters have different conversion ratios.

8. The SRAM as defined in claim 6, wherein said first and second converters effect different voltage drops.

9. The SRAM as defined in claim 6, wherein each of said first and second level converters has a control input controlling an output level of said each of said first and second level converters.

10. The SRAM as defined in claim 1, further comprising at least one another reference voltage generator, wherein one of outputs of said reference voltage generator and said another reference voltage generator is selectively input to said impedance converter.

11. The SRAM as defined in claim 1, further comprising at least one another impedance converter, wherein one of said impedance converter and said another impedance converter is selectively connected between said reference voltage generator and said word line driver.

12. The SRAM as defined in claim 1, wherein said reference voltage generator generates said reference voltage based on an internal reference voltage, and said internal reference voltage is changed between an operational mode and a standby mode of said SRAM.

13. The SRAM as defined in claim 12, further comprising another impedance converter, wherein said impedance converter and said another impedance converter are selected in said operational mode and said standby mode, respectively.

14. The SRAM as defined in claim 1, wherein said reference voltage generator comprises a monitor circuit including a first transistor and a load resistor connected in series between a first source line and a second source line, an operational amplifier having an inverting input connected to a node connecting said first transistor and said load resistor together, and a non-inverting input for receiving an internal reference voltage, a second transistor having a source connected to a third source line and a gate connected to an output of said operational amplifier, a current source connected between a drain of said second transistor and said second source line, said drain of said second transistor being connected to a gate of said first transistor, wherein said first source line has a voltage level lower than a voltage level of said third source line.

15. The SRAM as defined in claim 1, wherein power source voltage for said reference voltage generator and said impedance converter is higher compared to a power source voltage supplied to said bit lines in said precharge mode.

* * * * *